(12) United States Patent
Terada et al.

(10) Patent No.: US 7,583,867 B2
(45) Date of Patent: Sep. 1, 2009

(54) OPTICAL MODULE

(75) Inventors: Koji Terada, Kawasaki (JP); Jun Matsui, Kawasaki (JP); Hiroyuki Nobuhara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/064,454

(22) Filed: Feb. 24, 2005

(65) Prior Publication Data
US 2006/0110096 A1 May 25, 2006

(30) Foreign Application Priority Data
Nov. 19, 2004 (JP) ............................. 2004-336462

(51) Int. Cl.
*G02B 6/12* (2006.01)
(52) U.S. Cl. .......................................... 385/14; 385/88
(58) Field of Classification Search .................... 385/88
See application file for complete search history.

(56) References Cited

U.S. PATENT DOCUMENTS

| 5,625,734 | A * | 4/1997 | Thomas et al. | ................. 385/88 |
| 6,203,212 | B1 | 3/2001 | Rosenberg et al. | |
| 6,217,231 | B1 | 4/2001 | Mesaki et al. | |
| 6,425,691 | B1 | 7/2002 | Demangone | |
| 6,492,698 | B2 * | 12/2002 | Kim et al. | ..................... 257/432 |
| 7,056,032 | B2 * | 6/2006 | Cheng et al. | ................... 385/88 |
| 2003/0026553 | A1 * | 2/2003 | Stack | ........................... 385/88 |

FOREIGN PATENT DOCUMENTS

| JP | 4-329699 | 11/1992 |
| JP | 9-270747 | 10/1997 |
| JP | 10-300987 | 11/1998 |
| JP | 11-23391 | 1/1999 |
| JP | 11-202166 | 7/1999 |
| JP | 2000-82830 | 3/2000 |
| JP | 2002-98842 | 4/2002 |

* cited by examiner

*Primary Examiner*—Uyen Chau N Le
*Assistant Examiner*—Hoang Tran
(74) *Attorney, Agent, or Firm*—Staas & Halsey LLP

(57) ABSTRACT

An optical module includes a photoelectric element that performs a conversion between an optical signal and an electric signal; a body having a first surface and a second surface, the first surface and the second surface being continued and adjacent to each other; and an electric circuit board that is mounted on the body, the electric circuit board having a bending portion that is bent along the first surface and the second surface. The photoelectric element is mounted on one portion arranged on the first surface bordering on the bending portion. An electric wiring board on which a wiring unit for an external connection is formed is mounted on other portion arranged on the second surface.

19 Claims, 12 Drawing Sheets

OPTICAL MODULE

CROSS-REFERENCE TO RELATED APPLICATIONS

This application is based upon and claims the benefit of priority from the prior Japanese Patent Application No. 2004-336462, filed on Nov. 19, 2004, the entire contents of which are incorporated herein by reference.

BACKGROUND OF THE INVENTION

1) Field of the Invention

The present invention relates to an optical module having an electric circuit board to which a photoelectric element is electrically connected, and more particularly, to an optical module used for a data transfer system in a server system and the like.

2) Description of the Related Art

Recently, in data transfer systems such as a server system, data transfer is carried out using an optical signal, while performing data processing using an electric signal, and a so-called optical module is used for the data transfer by the optical signal. The optical module includes a photoelectric transducer (photoelectric element) that converts an electric signal to an optical signal (E/O conversion) or converts an optical signal to an electric signal (O/E conversion), and an optical element that propagates the optical signal therethrough, such as an optical fiber, and is formed by optically coupling these elements. By appropriately combining the photoelectric transducers and the optical elements, an optical transmission module that transmits an optical signal via the optical element and a so-called optical reception module that receives an optical signal via the optical element can be configured.

For example, in the current large-scale server system or the like, a plurality of optical modules are mounted in parallel on an optical module-mounting portion, in order to realize parallel transmission of a large number of optical signals. Therefore, it is desired that the optical modules for parallel transmission used in such a large-scale server system or the like are small and can be manufactured at a low cost, and can realize low power consumption. In order to realize this, for example, the number of parts constituting the optical module is reduced as much as possible, or highly efficient and stabilized optical coupling is realized in the transfer of optical signals in the optical module.

FIG. 20 is an exploded perspective view of a conventional optical module. An optical module 900 shown in FIG. 20 has the primary objective of reduction in cost, among the demands for miniaturization, low cost, and low power consumption. The optical module 900 includes a ferrule 902 housing an optical fiber array 901, an electric circuit board 904 having an electric circuit 903 mounted thereon, a photoelectric transducer 905, a flexible circuit board 906 for electrically connecting the photoelectric transducer 905 to the electric circuit board 904, a support member 908 that supports a micro lens array 907, and a spacer 909 mechanically coupled to the support member 908. In the optical module 900, a facet 902a of the ferrule 902 and the photoelectric transducer 905 are arranged to face each other, the electric circuit board 904 is arranged on the opposite side of the photoelectric transducer 905 facing the ferrule 902, and the photoelectric transducer 905 and the electric circuit board 904 are connected by the flexible circuit board 906 substantially bent at a right angle. Thus, by forming the spacer 909 directly on the flexible circuit board 906, low production cost is realized (see, for example, Japanese Patent Application Laid-Open No. 2000-82830). Other known techniques related to the present invention are disclosed in, for example, Japanese Patent Application Laid-Open Nos. H09-270747, H10-300987, H11-202166, and 2002-98842.

However, in the optical module 900 shown in FIG. 20, since an optical coupling unit (for example, the ferrule 902), which becomes the main mounting portion to the optical module-mounting portion in the server system or the like, and the electric circuit board 904 having the electric circuit 903 are arranged in parallel in a direction of L in FIG. 20, the mounting space of the optical module 900 increases, it is difficult to realize high-density parallel mounting to a module rack or the like due to miniaturization of the optical module-mounting portion, and the server system may become large, thereby restricting realization of the miniaturization and low cost by reduction of the mounting space and the mounting cost.

In order to realize highly efficient optical coupling, parts such as the micro lens array 907, the support member 908, and the spacer 909 are required other than the photoelectric transducer 905 and the ferrule 902, and hence, it is difficult to realize miniaturization and low cost by reducing the number of parts.

The techniques described in Japanese Patent Application Laid-Open Nos. H09-270747, H10-300987, H11-202166, and 2002-98842 do not particularly realize miniaturization, low cost, and low power consumption by reducing the mounting space of the optical module.

SUMMARY OF THE INVENTION

It is an object of the present invention to solve at least the above problems in the conventional technology.

An optical module according to one aspect of the present invention includes a photoelectric element that performs a conversion between an optical signal and an electric signal; a body having a first surface and a second surface, the first surface and the second surface being continued and adjacent to each other; and an electric circuit board that is mounted on the body, the electric circuit board having a bending portion that is bent along the first surface and the second surface. The photoelectric element is mounted on one portion arranged on the first surface bordering on the bending portion. An electric wiring board on which a wiring unit for an external connection is formed is mounted on other portion arranged on the second surface.

An optical module according to another aspect of the present invention includes a protective member that protects an optical propagation path; a flexible wiring member that is mounted on a surface of the protective member with a first surface toward the surface of the protective member, the flexible wiring member having a wire; and an optical element that transmits or receives an optical signal via the optical propagation path, the optical element being electrically connected to the wiring of the flexible wiring member, and fitted to a second surface of the flexible wiring member opposite to the first face. The flexible wiring member includes a propagation path-ensuring portion for transmitting or receiving the optical signal between the optical propagation path and the optical element, and is bent in such a manner that a part of the first surface is opposed to a side of the protective member different from the surface on which the flexible wiring member is mounted.

The other objects, features, and advantages of the present invention are specifically set forth in or will become apparent

DETAILED DESCRIPTION

Exemplary embodiments according to the present invention will be explained in detail below with reference to the accompanying drawings.

An optical module according to a first embodiment of the present invention will be explained. The optical module of the first embodiment is a light-emitting module using a light emitting element that emits an optical signal as a photoelectric element.

Figure 1:
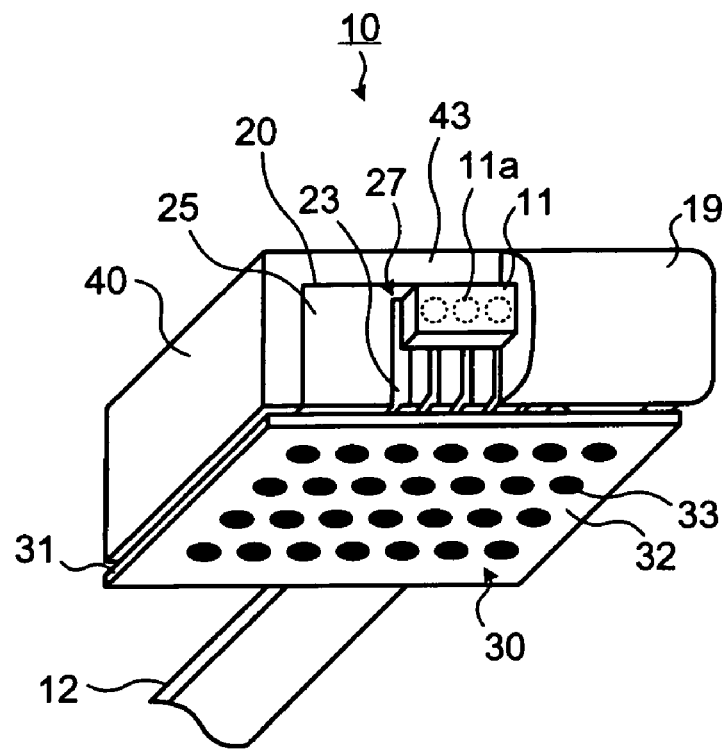
FIG. 1 is a perspective view of the configuration of a light-emitting module according to a first embodiment of the present invention.
Figure 2:
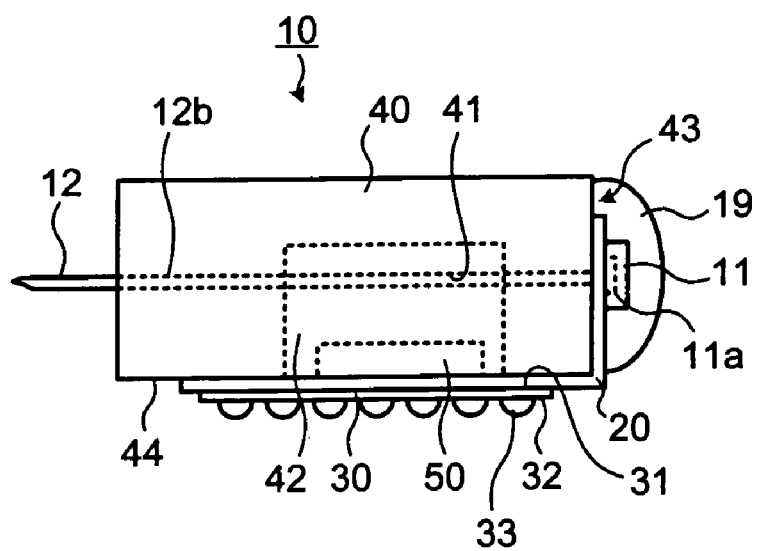
FIG. 2 is a side elevation of the light-emitting module according to the first embodiment.

FIG. 1 is a perspective view of the configuration of the light-emitting module according to the first embodiment of the present invention, and FIG. 2 is a side elevation of the light-emitting module. As shown in the drawings, a light-emitting module 10 includes a light emitting element 11 as an optical element that emits an optical signal, an optical fiber 12 as an optical propagation path (optical element) that propagates the optical signal emitted from the light emitting element 11, a flexible circuit board 20 as the electric circuit board electrically connected to the light emitting element 11, a ball grid array (BGA) substrate 30 for external connection that electrically connects the flexible circuit board 20 to an external electric circuit (other circuit boards and the like, not shown), an optical fiber connector 40 as a body serving as a protective member that houses and protects the terminal of the optical fiber 12, and an electric component (electric circuit 50 and the like shown in FIG. 2) as an electric circuit electrically connected to the light emitting element 11 via the flexible circuit board 20. Therefore, the light-emitting module 10 is formed as a so-called optical transmission module.

The light emitting element 11 is formed of a rectangular element in the first embodiment, and includes an optical unit 11a that emits the optical signal therein, with the light emitting element 11 mounted on and connected to the flexible circuit board 20 so that the optical unit 11a faces an optical propagation path 21 explained later (see FIGS. 5 to 7). The optical unit 11a is appropriately formed of a single channel, four channels, or twelve channels corresponding to the number of channels of the optical fiber 12. The light emitting element 11 may be formed by appropriately changing the length in the longitudinal direction according to the arrangement of the optical unit 11a arranged according to the number of channels of the optical fiber 12.

As the light emitting element 11, for example, a semiconductor laser (laser diode (LD)), such as a vertical cavity surface emitting laser (VCSEL) can be applied.

The optical fiber 12 is housed, for example, in an optical waveguide unit 41 in which a terminal 12b of the optical fiber 12 is formed therein so as to pass through between a pair of opposite facets of the optical fiber connector 40. The optical fiber 12 is fixed to the optical fiber connector 40 by filling an adhesive or the like in a space 42 communicated with the optical waveguide unit 41. The optical fiber 12 is formed of a multi mode optical fiber (MMF) or a single mode optical fiber (SMF), and in the case of the MMF, a step index (SI) type or a graded index (GI) type is used.

The terminal 12b of the optical fiber 12 housed in the optical waveguide unit 41 of the optical fiber connector 40 may be or may not be covered. The optical fiber 12 includes an optical fiber cable in which a core and a cladding are covered with a cover.

Figure 3:
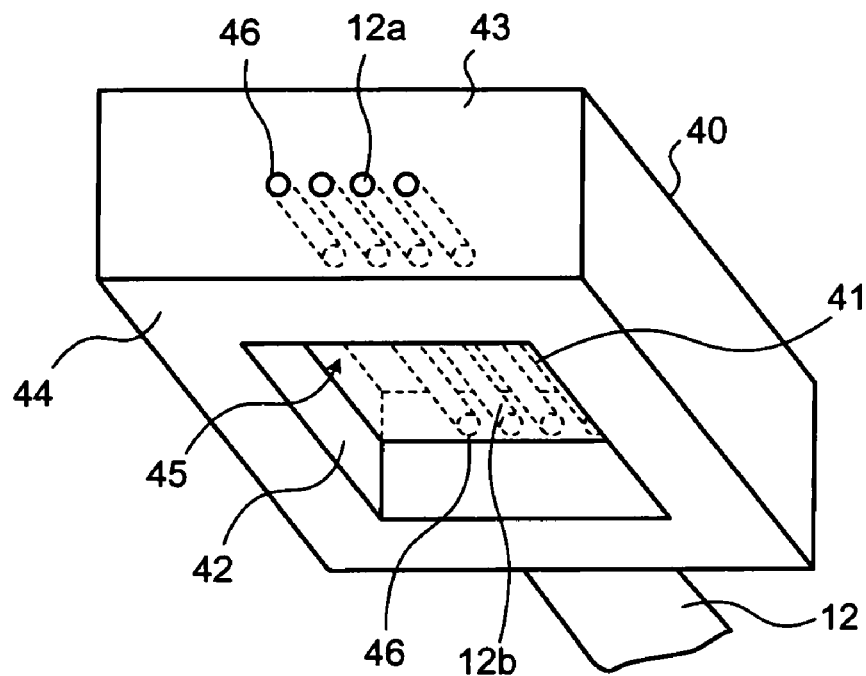
FIG. 3 is a perspective view of the body of the light-emitting module according to the first embodiment.
Figure 4:
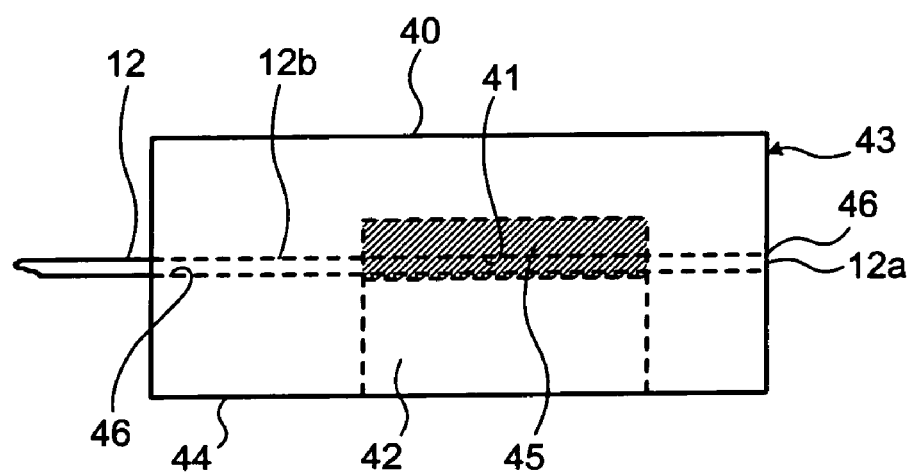
FIG. 4 is a side elevation of the body of the light-emitting module according to the first embodiment.

FIG. 3 is a perspective view of the body of the light-emitting module. FIG. 4 is a side elevation of the body of the light-emitting module. As shown in the drawings, the optical fiber connector 40 as the body that houses the optical fiber 12 is formed of, for example, a resin molded member having a rectangular appearance molded by transfer molding, injection molding, or the like, and includes the optical waveguide unit 41 that houses the terminal 12b of the optical fiber 12 and the space 42.

The optical fiber connector 40 includes a facet (first surface) 43 on which the light emitting element 11 is installed, as a photoelectric element installation surface, and a facet (second surface) 44 on which the BGA substrate 30 is installed, as an installation surface of a substrate for external connection. These facets 43 and 44 are formed in positions of continuous and adjacent surfaces in the optical fiber connector 40. The optical fiber connector 40 houses the optical fiber 12 with the facet 12a of the terminal 12b thereof exposed on the facet 43. That is, the optical waveguide unit 41 of the optical fiber connector 40 includes holes 46 formed in the optical fiber connector 40, and a part of the space 42 communicated with the holes 46.

The optical fiber 12 housed in the optical fiber connector 40 is fixed to the optical fiber connector 40 in the space 42 of the optical waveguide unit 41 by a fixing unit 45 formed of an adhesive or the like filled in the space 42. The space 42 is formed, for example, in a shape depressed inward from the facet 44. For example, a known mechanically transferable (MT) connector, ferrule, or the like can be used for the optical fiber connector 40, though not shown in the first embodiment. Any structure of a so-called plug type and a receptacle type can be applied.

Figure 5:
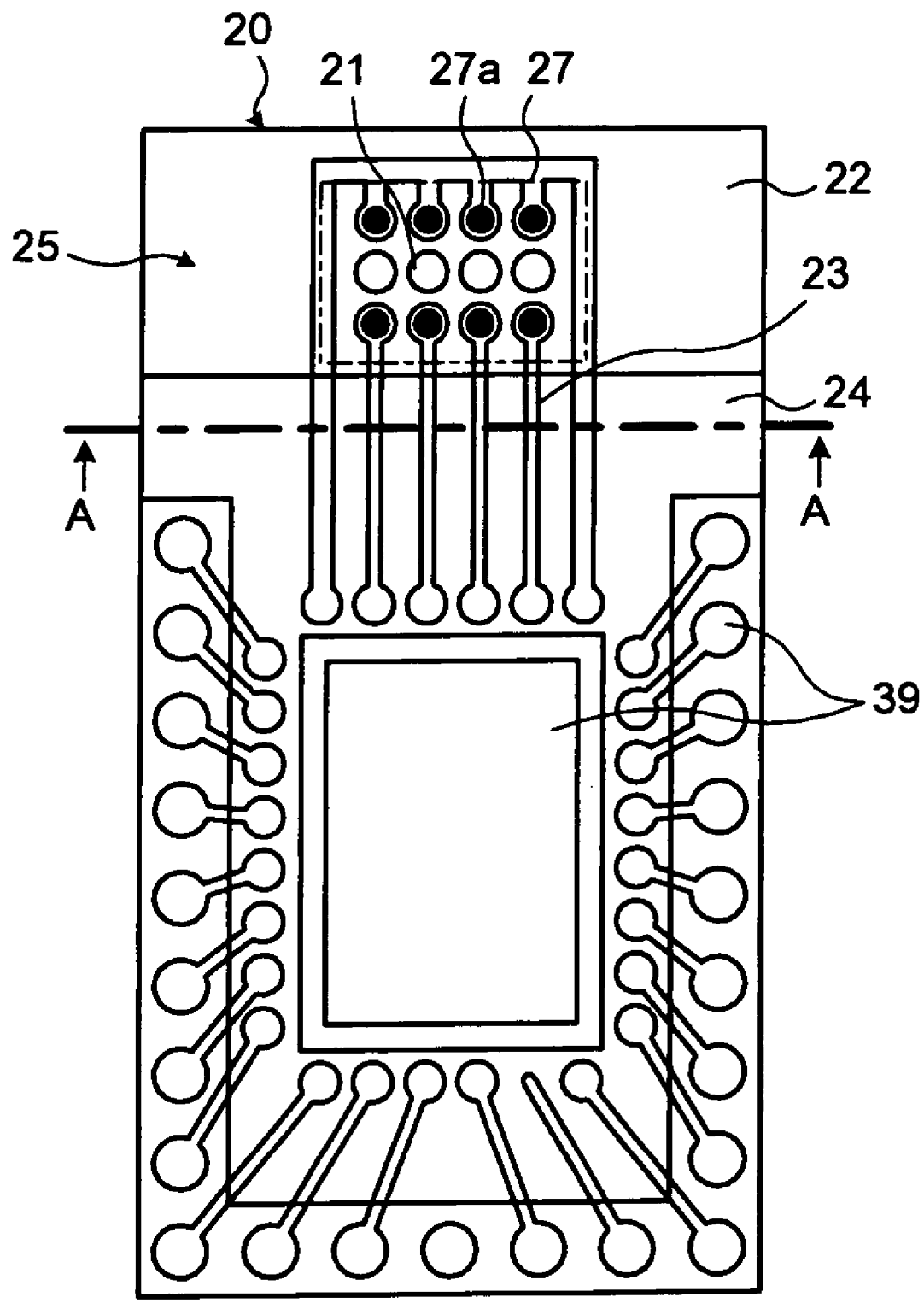
FIG. 5 is a plan view of an electric circuit board of the light-emitting module according to the first embodiment.
Figure 6:
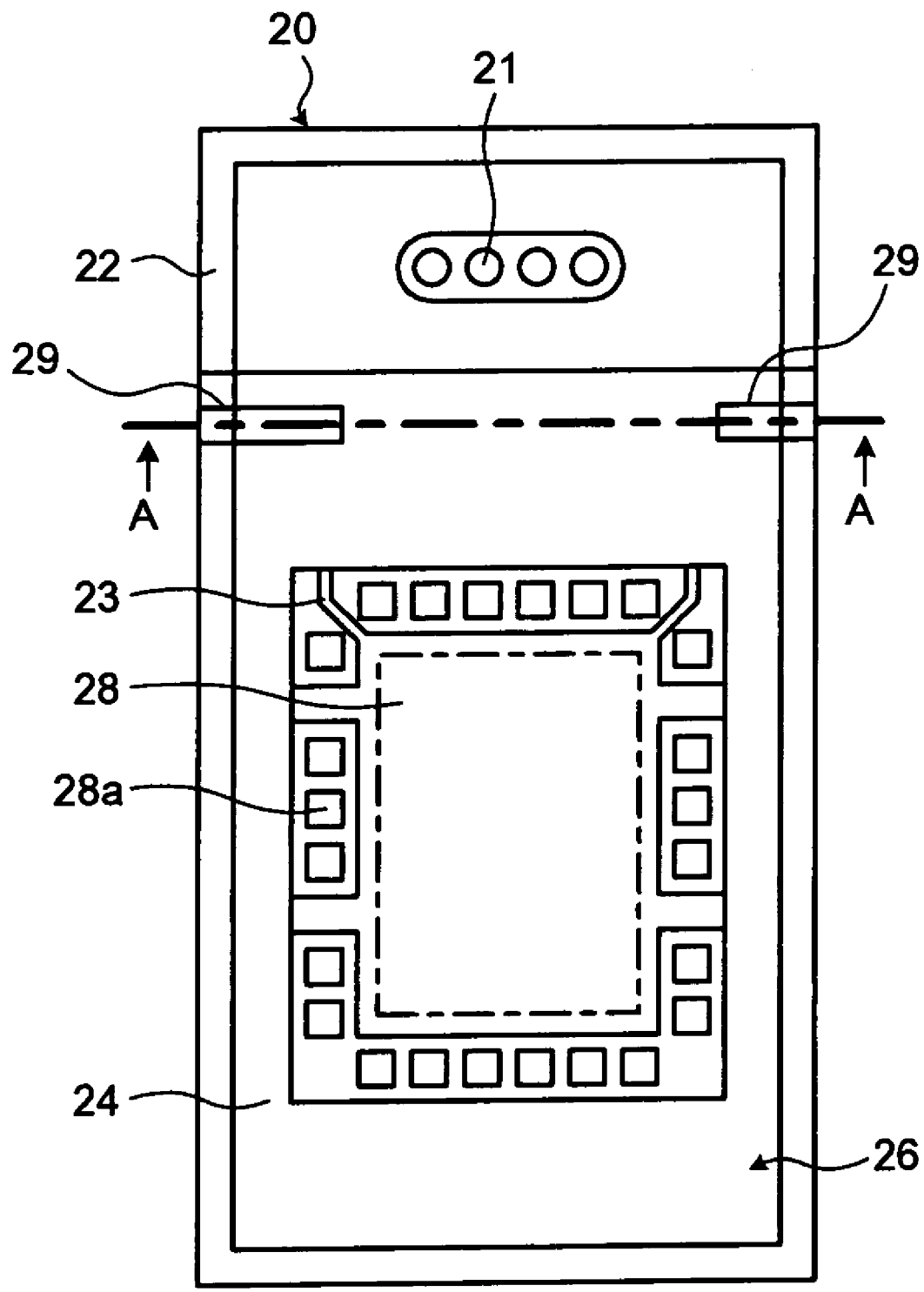
FIG. 6 is a plan view of the electric circuit board of the light-emitting module according to the first embodiment.

FIGS. 5 and 6 are plan views of the electric circuit board of the light-emitting module. FIG. 5 is an example as seen from the surface on which the light emitting element is mounted, and FIG. 6 is an example as seen from the other side on which the electric circuit is mounted. FIG. 7 is a side elevation of the electric circuit board of the light-emitting module. As shown in these drawings, the flexible circuit board 20 electrically connected to the light emitting element 11 (not shown in FIGS. 5 to 7) includes a nonconductive base film 22 formed of, for example, polyethylene terephthalate resin (PET), polyethylene naphthalate (PEN), polyimide (PI), or the like.

Figure 7:
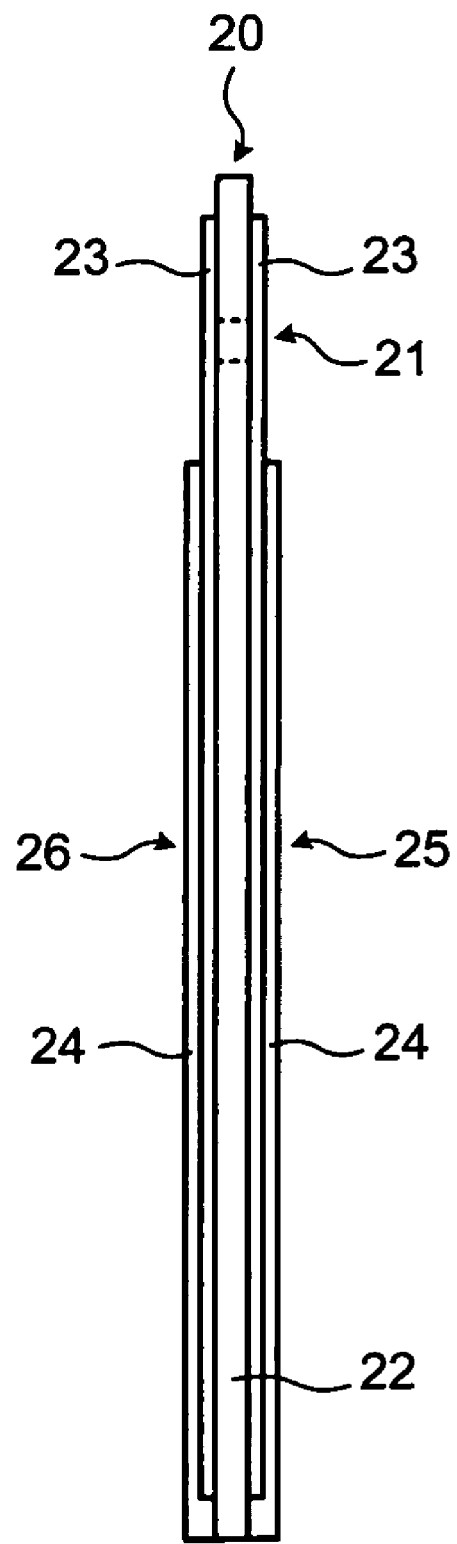
FIG. 7 is a side elevation of the electric circuit board of the light-emitting module according to the first embodiment.

The flexible circuit board 20 includes electrical wiring layers 23 formed of a wiring pattern formed by laminating a conductive material such as a copper foil or Au on the base film 22, and etching the conductive material, on the both surfaces 25 and 26 (see FIG. 7). For example, as shown in FIG. 5, the electrical wiring layer 23 is formed in a wiring pattern by which appropriate electric signals can be transmitted, matched with the number of arrangement of the optical units 11a of the light emitting element 11, on the face 25 of the flexible circuit board 20 (hereinafter, "surface 25").

For example, as shown in FIG. 6, the electrical wiring layer 23 is formed in a wiring pattern by which appropriate electric signals can be transmitted to the electric circuit 50, on the face 26 of the flexible circuit board 20 (hereinafter, "rear surface 26"). The electrical wiring layer 23 of the flexible circuit board 20 is formed so as to have a characteristic impedance, matched with an input impedance of the light emitting element 11 herein.

The flexible circuit board 20 includes a cover lay 24 formed by covering a film of a nonconductive synthetic resin or the like on the base film 22 and the electrical wiring layer 23. A mounting region 27 (see FIG. 5) on which the light emitting element 11 is mounted, and substrate-connecting wiring units 39 for the connection with the BGA substrate 30 are provided on the surface 25 of the flexible circuit board 20.

A mounting region 28 (see FIG. 6) on which the electric circuit 50 is mounted is provided on the rear surface 26 of the flexible circuit board 20. The rear surface 26 is a side installed on the optical fiber connector 40 as explained later.

The cover lay 24 is not formed In the mounting region 27 of the light emitting element 11 on the surface 25 or in the mounting region 28 of the electric circuit 50 on the rear surface 26, and the electrical wiring layer 23 (including the substrate-connecting wiring unit 39), which is originally covered with the cover lay 24, is exposed, so that bonding of the light emitting element 11, the electric circuit 50, the BGA substrate 30, and the electrical wiring layer 23 becomes easy.

A wiring unit for connection with the light emitting element 11 and the electric circuit 50 is respectively formed in the mounting regions 27 and 28 in the electrical wiring layer 23. For example, the wiring unit for connection in the mounting region 27 on the surface 25 is formed of a solder bump 27a for mounting a flip chip (see FIG. 5), and the wiring unit for connection in the mounting region 28 on the rear surface 26 is formed of a pad 28a (see FIG. 6) for wire bonding.

For example, as a forming method for the solder bump 27a, a method of forming the solder bump 27a by forming a resist pattern in which the forming portions of the solder bump 27a are cut out on the surface 25 of the flexible circuit board 20 by using the photolithography technique, and forming a solder only in the electrical wiring layer 23 at the portions where the resist is cut out by plating or the like can be adopted. A method of forming the solder bump 27a by forming a solder in the electrical wiring layer 23, with electrode pad-forming portions exposed by etching or the like can be also adopted.

In FIGS. 5 to 7, the flexible circuit board 20 has a considerable thickness for convenience of explanation, but the flexible circuit board 20 is an extremely thin circuit board having a thickness of, for example, 50 micrometers, and has flexibility so that the flexible circuit board 20 can be bent easily.

For example, the optical propagation path 21 formed of a through path penetrated in the thickness direction of the flexible circuit board 20 is formed in the thickness direction of the flexible circuit board 20 at positions where the optical units 11a of the light emitting element 11 to be mounted are positioned, matched with the number of arrangement of the optical units 11a (four (four channels) in this example), in the mounting region 27 on the surface 25 of the flexible circuit board 20. The optical propagation path 21 functions as a propagation path-ensuring portion that propagates the optical signal transferred between the light emitting element 11 and the optical fiber 12. For example, when the base film 22 of the flexible circuit board 20 is formed of a material having a transparent transmission characteristic with respect to the optical signal, the through path may not be formed in the flexible circuit board 20 as the optical propagation path 21, and the propagation path for the optical signal can be ensured as with the through path.

In the light-emitting module 10, the flexible circuit board 20 is fitted and fixed to the optical fiber connector 40 by being bent with the rear surface 26 side as a valley and the surface 25 side as a peak, at a position shown by a broken line A-A (hereinafter, "position of broken line A-A") in FIGS. 5 and 6.

At the position of broken line A-A of the flexible circuit board 20, the electrical wiring layer 23 having portions 29 where the wiring is not formed (see FIG. 6), formed for example in a pattern with a part of a solid pattern in the electrical wiring layer 23 being cut out, is formed to construct the flexible circuit board 20, for facilitating bending. For example, a notch (not shown) may be formed in the base film 22 to construct the flexible circuit board 20.

On the other hand, as shown in FIGS. 1 and 2, the BGA substrate 30 has a structure in which a plurality of external connection pads 33 are formed on an external input and output side facet 32, and is formed in a size that can be accommodated in the facet 44 when fitted to the facet 44 of the optical fiber connector 40. The BGA substrate 30 is mounted on the surface 25 of the flexible circuit board 20 by connecting the connection wiring unit (not shown) formed on a circuit board-mounting face 31 opposite to the external input and output side facet 32 with the substrate-connecting wiring unit 39 (see FIG. 5) on the surface 25 of the flexible circuit board 20.

For the substrate for external connection of the light-emitting module 10, for example, a BGA connector having a structure detachable with respect to the external electric circuit connected to the flexible circuit board 20 can be used other than the BGA substrate 30. The substrate-connecting wiring unit 39 of the flexible circuit board 20 may be directly connected to the external electric circuit and the like without providing the BGA substrate 30.

The electric circuit 50 is mounted on the mounting region 28 (see FIG. 6) opposite to the mounting position of the BGA substrate 30 on the rear surface 26 of the flexible circuit board 20, by connecting a joining terminal (not shown) of the electric circuit 50 to the pads 28a. The electric circuit 50 is formed of, for example an integrated circuit (IC) or a large scale integration (LSI), drives the light emitting element 11, and performs transmission and control of optical signals and electric signals in the light-emitting module 10. Specifically, the electric circuit 50 in the first embodiment includes a laser driver and a main amplifier of the light emitting element 11.

As shown in FIGS. 1 and 2, the light-emitting module 10 configured as above has the following characteristics. That is, the flexible circuit board 20, in which the light emitting element 11 and the BGA substrate 30 are mounted on the surface 25 thereof, and the electric circuit 50 is mounted on the rear surface 26 thereof, is bent at the position of broken line A-A along the facets 43 and 44 of the optical fiber connector 40, with the rear surface 26 side as a valley and the surface 25 side as a peak, and fitted and fixed to the optical fiber connector 40.

Therefore, the electric circuit 50 and the BGA substrate 30 in the light-emitting module 10 are overlapped on the facet 44 of the optical fiber connector 40, and the electric circuit 50 is housed in the space 42. The light emitting element 11 is installed on the facet 43 of the optical fiber connector 40.

The flexible circuit board 20 is fixed to the optical fiber connector 40 by using, for example, an ultraviolet hardening-type optical adhesive applied to or filled in between the flexible circuit board 20 and the optical fiber connector 40. The flexible circuit board 20 and the light emitting element 11 on the facet 43 of the optical fiber connector 40 are sealed by an external sealing portion (a first sealing portion) 19, and the flexible circuit board 20 and the electric circuit 50 on the facet 44 are sealed by an internal sealing portion (a second sealing portion) 18 (see FIG. 15). Therefore, the flexible circuit board 20 is fitted and fixed firmly to the optical fiber connector 40.

At this time, the optical unit 11a of the light emitting element 11 mounted on the flexible circuit board 20 and the facet 12a of the optical fiber 12 exposed on the facet 43 are optically coupled via the optical propagation path 21 in the flexible circuit board 20, for example, by butt joint connection. Therefore, a coupling loss of the optical signals between the optical unit 11a and the facet 12a can be reduced considerably.

The flexible circuit board 20 is fitted and fixed to the optical fiber connector 40 by being bent substantially at a right angle, with the rear surface 26 side as a valley and the surface 25 side as a peak. However, even when the facets 43 and 44 of the optical fiber connector 40 are not in a position substantially at a right angle as seen from the side, the flexible circuit board 20 needs only to be fitted and fixed in a state bent along the facets 43 and 44.

Therefore, the light-emitting module 10 has an outer diameter of about the size of the optical fiber connector 40 in the assembled state shown in FIG. 1, and hence, can considerably reduce the space occupied by the optical fiber connector 40 and the flexible circuit board 20, for example, as compared with a conventional optical module, and can reduce the height, the width, and the depth of the light-emitting module 10 as much as possible, to realize miniaturization. Since miniaturization of the light-emitting module 10 itself is possible, for example, the mounting space of the light-emitting module 10 to an optical module-mounting portion in a server system or the like or to a mount board housed in the optical module-mounting portion can be reduced as much as possible.

Figure 8:
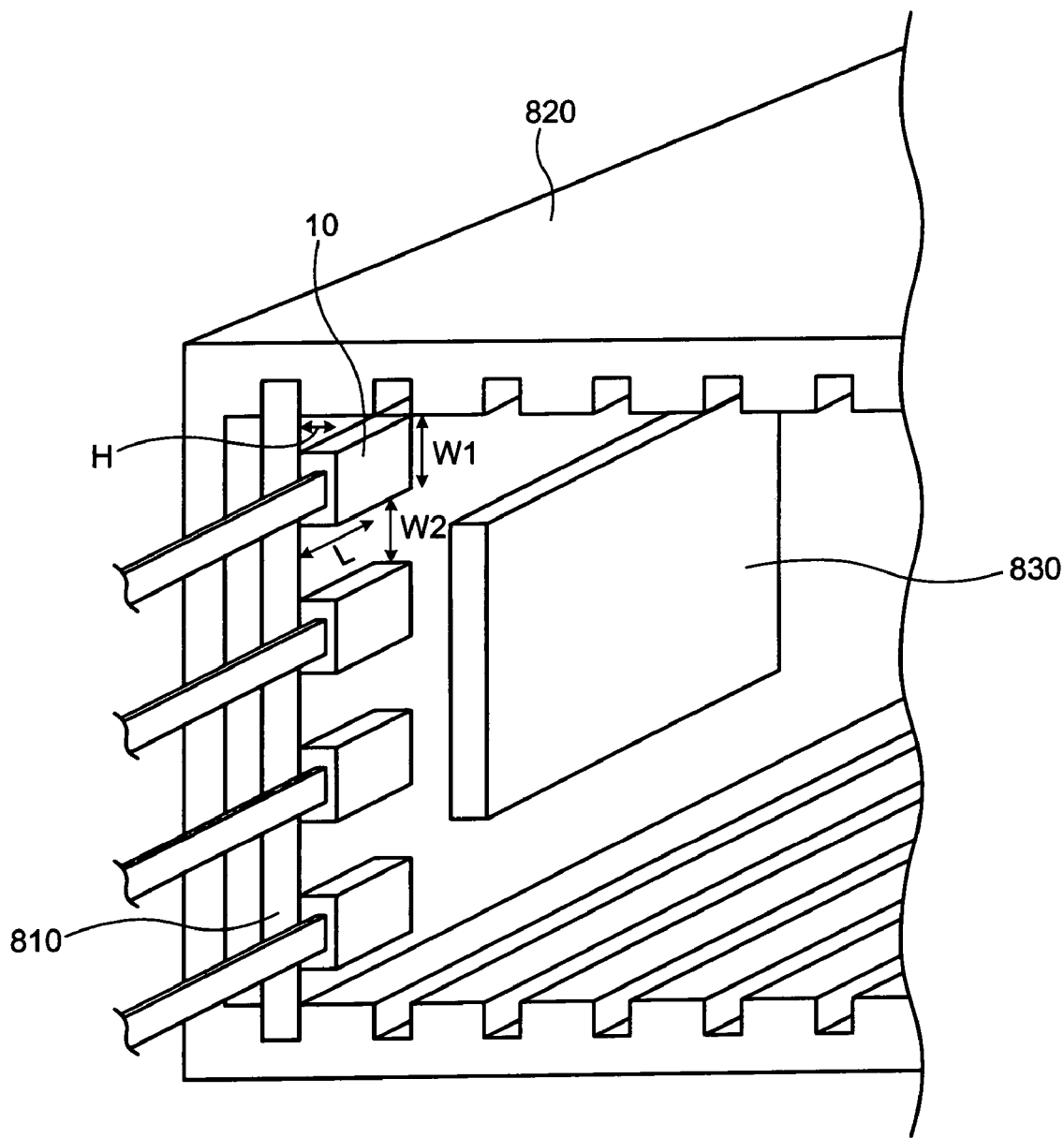
FIG. 8 is a simple perspective view of an optical module-mounting portion in a server system or the like, which houses a mount board having the light-emitting module according to the first embodiment mounted thereon.

FIG. 8 is a simple perspective view of the optical module-mounting portion in a server system or the like, which houses a mount board having the light-emitting module mounted thereon. As shown in this drawing, the light-emitting module 10 having reduced height H, width W1, and depth L is mounted on a mount board 810 housed in a module rack 820 in a server system or the like as the optical module-mounting portion, via the BGA substrate 30 (not shown in FIG. 8).

Accordingly, in the optical module-mounting portion, for example, the interval W2 between the adjacent light-emitting modules 10 on the mount board 810 is narrowed, thereby enabling parallel mounting of a plurality of light-emitting modules 10 on the mount board 810 at a high density. At the same time, for example, the mount board 810 on which the light-emitting modules 10 are mounted can be housed in the module rack 820 at a higher density.

Therefore, when the mounting space of the light-emitting module 10 on the mount board 810 is reduced, the mounting space allocated to other electric circuit 830 and the like to be mounted on the mount board 810, and the mounting space of the mount board 810 in the module rack 820 can be ensured more efficiently. Accordingly, a large-scale parallel transmission of optical signals can be realized.

Therefore, for example, miniaturization of the optical module-mounting portion can be realized as the whole server system or the like, thereby enabling achievement of low cost by reducing the installation space and the material cost accompanying miniaturization, and of low power consumption of the optical module-mounting portion, to improve the performance of the whole system. Thus, according to the light-emitting module 10, reduction in cost accompanying the reduction in the mounting space in the server system or the like can be particularly facilitated.

Figure 9:
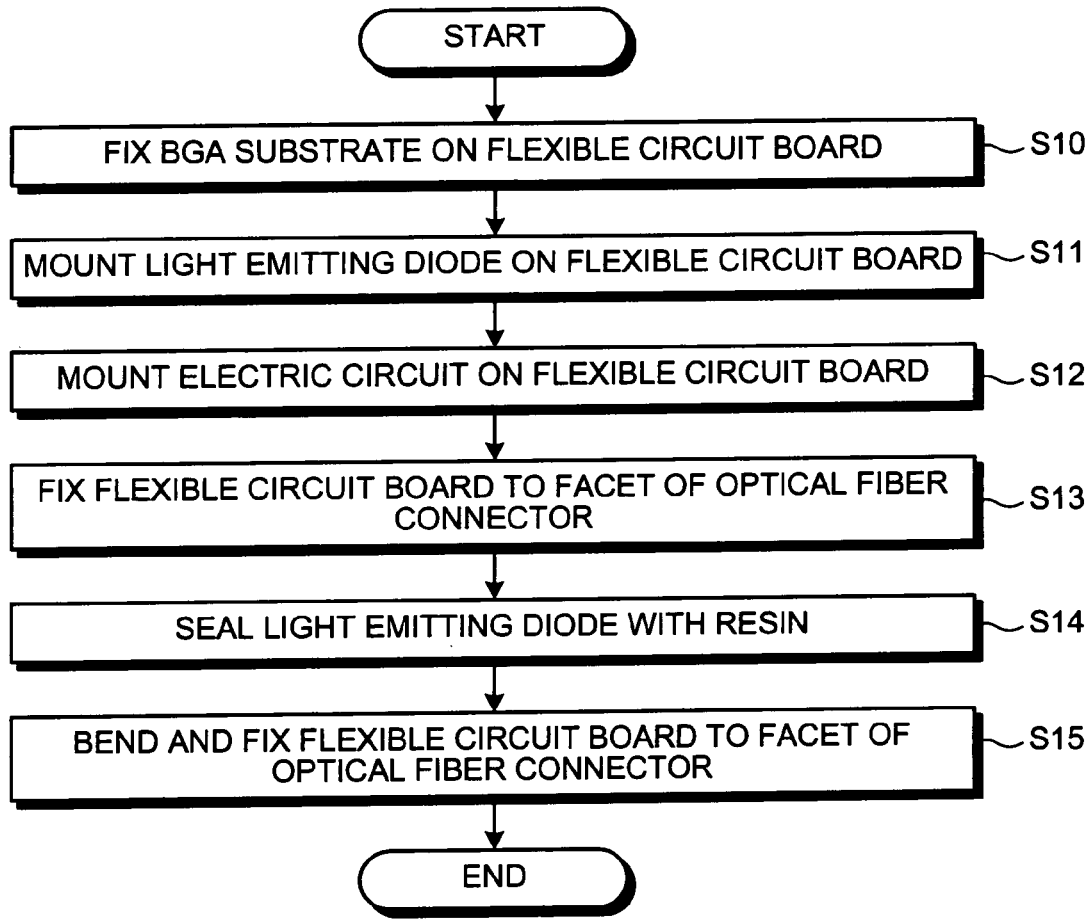
FIG. 9 is a flowchart of an assembly process of the light-emitting module according to the first embodiment.
Figure 10:
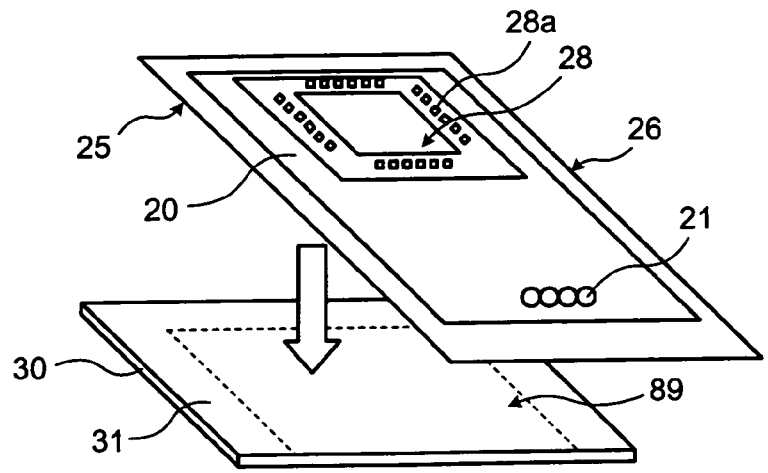
FIG. 10 is an explanatory diagram of the assembly process of the light-emitting module according to the first embodiment.

The light-emitting module 10 can be assembled for example by the following method. FIG. 9 is a flowchart of an assembly process of the light-emitting module. FIGS. 10 to 15 are explanatory diagrams of the assembly process of the light-emitting module. As shown in FIG. 10, the surface 25 of the flexible circuit board 20 and a circuit board-mounting face 31 of the BGA substrate 30 are arranged so as to face each other, and the BGA substrate 30 is connected and fixed to the surface 25 of the flexible circuit board 20 (step S10). At this time, the BGA substrate 30 is connected to the flexible circuit board 20 in a connection region 89 shown by a broken line in the drawing on the circuit board-mounting face 31, so that the substrate-connecting wiring units 39 (see FIG. 5) formed on the flexible circuit board 20 and the terminal (not shown) of the external electric circuit to be connected by the BGA substrate 30 are connected to each other at a normal position.

Figure 11:
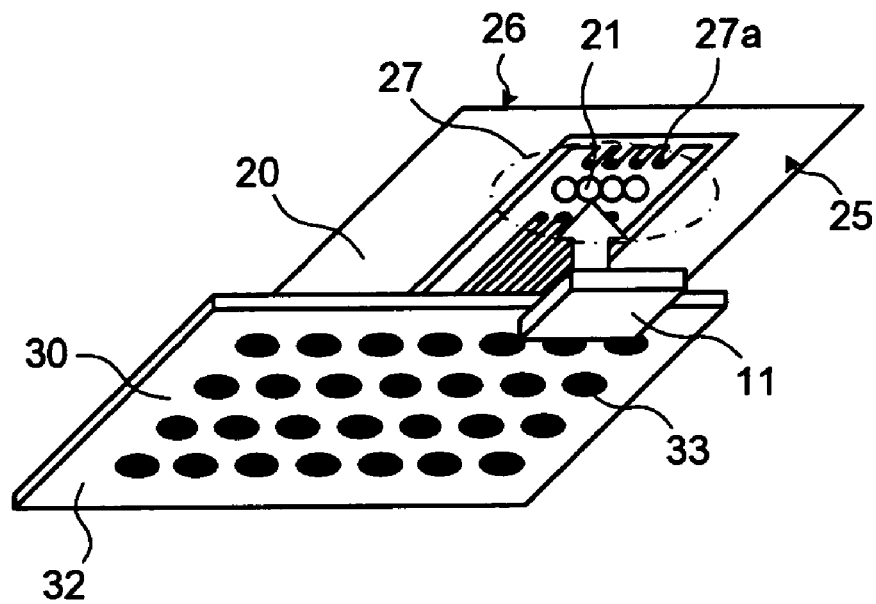
FIG. 11 is an explanatory diagram of the assembly process of the light-emitting module according to the first embodiment.

As shown in FIG. 11, the light emitting element 11 is mounted on (installed in) the mounting region 27 on the surface 25 of the flexible circuit board 20 so that the optical unit 11a (not shown in FIGS. 11, 13, and 14) is directed toward the optical propagation path 21 formed on the flexible circuit board 20 (step S11). At this time, as the mounting method of the light emitting element 11, for example, a known flip chip mounting method can be used. At the time of mounting, the position of the optical unit 11a of the light emitting element 11 is observed from the optical propagation path 21 on the flexible circuit board 20 by using an image recognition apparatus or the like, to adjust the position of the light emitting element 11 so that the optical unit 11a is positioned substantially at the center of the optical propagation path 21. Thereafter, the solder bump 27a in the mounting region 27 is brought into contact with the electrode pad (not shown) of the light emitting element 11, to mount the light emitting element 11 by bonding the solder bump 27a and the electrode pad by ultrasonic welding or the like.

Figure 12:
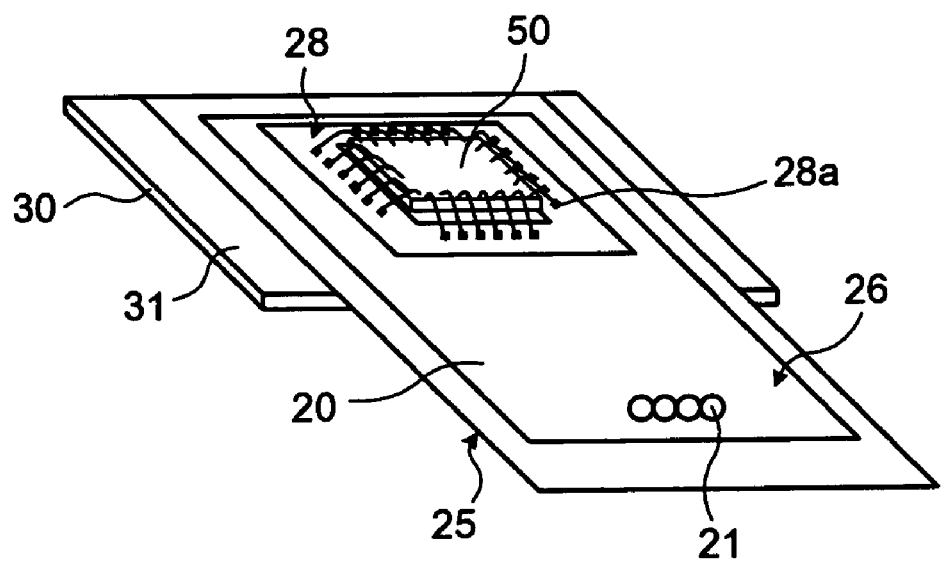
FIG. 12 is an explanatory diagram of the assembly process of the light-emitting module according to the first embodiment.

As shown in FIG. 12, after mounting the light emitting element 11 on the flexible circuit board 20, the electric circuit 50 is mounted on (installed in) the mounting region 28 on the rear surface 26 of the flexible circuit board 20 (step S12). At this time, the electric circuit 50 is fixed at a predetermined position in the mounting region 28 on the rear surface 26 by an adhesive (not shown) such as a silver paste. Then, the electric circuit 50 is connected to the electrical wiring layer 23 on the flexible circuit board 20 by wire-bonding the electrode pad (not shown) formed in the electric circuit 50 and the pad 28a in the mounting region 28.

When mounting the electric circuit 50, when there is another electric circuit (for example, an external amplifier) or the like to be mounted on the flexible circuit board 20, a pad 28a matched with the electric circuit is appropriately formed in the mounting region 28 on the rear surface 26 beforehand, and is mounted together with the electric circuit 50. The electric circuit 50 or the like to be mounted on the mounting region 28 of the flexible circuit board 20 can be housed in the space 42 in the optical fiber connector 40. Therefore, even when an electric circuit other than the electric circuit 50 is mounted on the flexible circuit board 20, the outer diameter of the light-emitting module 10 does not change.

Figure 13:
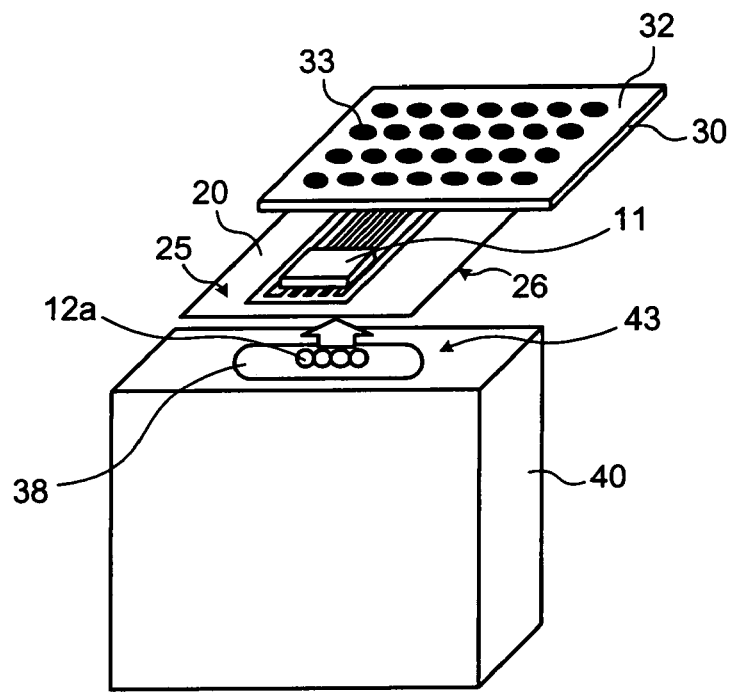
FIG. 13 is an explanatory diagram of the assembly process of the light-emitting module according to the first embodiment.

As shown in FIG. 13, after the electric circuit 50 is mounted on the rear surface 26 of the flexible circuit board 20, the rear surface 26 of the flexible circuit board 20 is fitted and fixed to the facet 43 of the optical fiber connector 40 (step S13). At this time, the light emitting element 11 mounted on the flexible circuit board 20 is driven to perform a so-called aligning operation of the facet 12a of the optical fiber 12 (not shown in FIGS. 13 and 14) exposed on the facet 43 of the optical fiber connector 40 and the optical unit 11a. The rear surface 26 of the flexible circuit board 20 is then fitted and fixed to the facet 43 of the optical fiber connector 40, by using an optical adhesive 38.

In order to drive the light emitting element 11 in the aligning operation, for example, a predetermined electric signal is supplied to the signal input/output terminal of the electric circuit 50 with the external electric circuit, a power terminal, a necessary control terminal, and the like via the BGA substrate 30. Alternatively, a predetermined electric signal is directly supplied to the flexible circuit board 20 via a probe, and the light emitting element 11 can be driven accordingly.

When the light emitting element 11 mounted on the flexible circuit board 20 is formed of an array structure having a plurality of optical units 11a, by driving only the optical units 11a at the opposite ends of the array, necessary aligning operation can be performed sufficiently, without requiring driving all of the optical units 11a. In the light-emitting module 10 in the first embodiment, the 4-channel array structure is used, but for example, a single-channel or a 12-channel structure may be used.

The aligning operation is performed so that the optical power of the optical signal emitted from the light emitting element 11 and output from the optical fiber 12 housed in the optical fiber connector 40 to an optical power meter (not shown) takes the maximum value. When the aligning operation performed in this manner ends, the optical adhesive 38 is applied to or filled in between the facet 43 of the optical fiber connector 40 and the rear surface 26 of the flexible circuit board 20. Thereafter, for example, beams such as ultraviolet rays are irradiated to the optical adhesive 38 to cure the optical adhesive 38, so that the flexible circuit board 20 is fitted and fixed to the facet 43. The optical adhesive 38 may be applied to the facet 43 and the like before the aligning operation.

Figure 14:
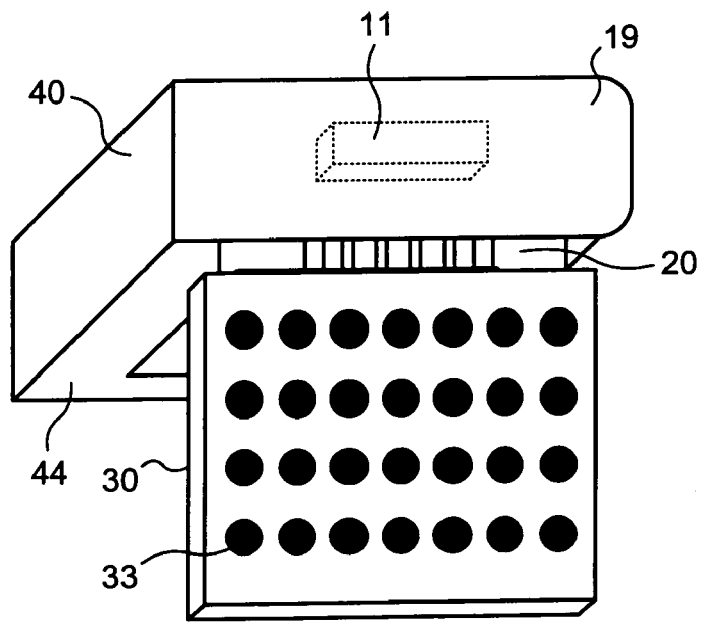
FIG. 14 is an explanatory diagram of the assembly process of the light-emitting module according to the first embodiment.

As shown in FIG. 14, for example, a sealing resin such as a mold resin is applied or filled to the facet 43 of the optical fiber connector 40, to which the flexible circuit board 20 is fixed, to seal the flexible circuit board 20 together with the light emitting element 11 by the external sealing portion 19 (step S14). At this time, when the viscosity of the sealing resin forming the external sealing portion 19 is low, and the sealing resin flows out before the applied sealing resin is cured, a dam (not shown) for forming the external sealing portion 19 at a desired position, formed by for example a high-viscosity silicone is formed beforehand around the position where the sealing resin is applied. In this manner, the external sealing portion 19 having a desired shape can be formed on the facet 43 of the optical fiber connector 40.

Figure 15:
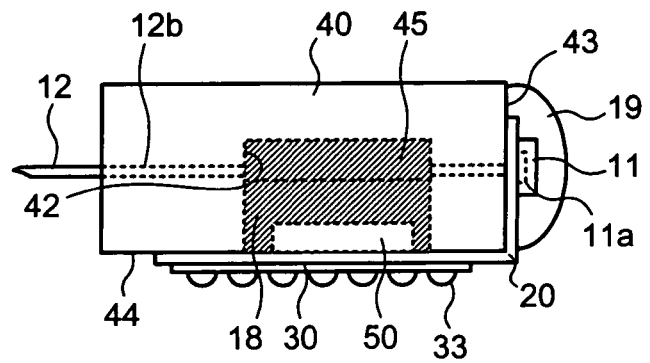
FIG. 15 is an explanatory diagram of the assembly process of the light-emitting module according to the first embodiment.

As shown in FIG. 15, the flexible circuit board 20 is bent at the position of broken line A-A (see FIGS. 5 and 6), with the rear surface 26 side as a valley following along the facets 43 and 44 of the optical fiber connector 40. At the same time, the sealing resin is filled into the space 42 in the optical fiber connector 40, to seal and fix the flexible circuit board 20, together with the electric circuit 50 housed in the space 42, by the internal sealing portion 18 (step S15).

The light-emitting module 10 can be assembled in this manner. The bending radius of the flexible circuit board 20 to be bent at the position of broken line A-A at step S15 needs only to be set at a curvature of about 0.5 millimeter. Preferably, the flexible circuit board 20 is formed in a size that does not go beyond the facets 43 and 44 of the optical fiber connector 40 to the outside, and when being fixed, the flexible circuit board 20 is fitted to the facets 43 and 44. In this manner, the flexible circuit board 20 does not affect the outer diameter of the light-emitting module 10.

The sealing resin constituting the external sealing portion 19 to be formed on the facet 43 of the optical fiber connector 40, and the sealing resin constituting the internal sealing portion 18 to be formed in the space 42 on the facet 44 of the optical fiber connector 40 may be the same or different. For the sealing resin constituting these sealing portions 18 and 19, for example, a thermoplastic resin (hot melt resin) can be used. The internal sealing portion 18 is formed of a sealing resin filled in the space 42.

Figure 16:
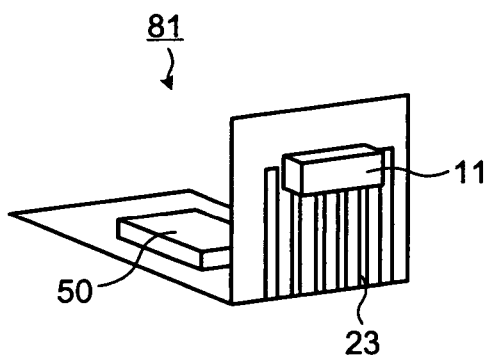
FIG. 16 is a perspective view of another electric circuit board of the light-emitting module according to the first embodiment.
Figure 17:
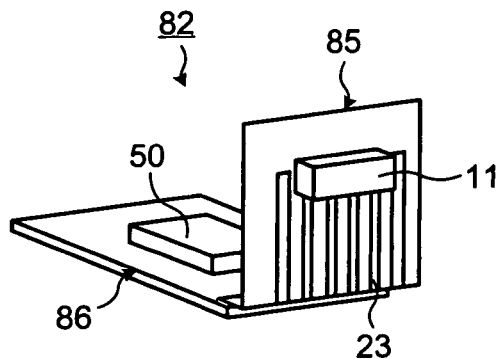
FIG. 17 is a perspective view of the another electric circuit board of the light-emitting module according to the first embodiment.

FIGS. 16 and 17 are perspective views of other electric circuit boards of the light-emitting module. In the light-emitting module 10, the flexible circuit board 20 is used as the electric circuit board for explanation, but the electric circuit boards as shown in FIGS. 16 and 17 may be used. That is, as shown in FIG. 16, the light-emitting module 10 may be formed by using a non-flexible rigid circuit board 81 formed in a pre-bent shape so as to follow the shape of the facets 43 and 44 of the optical fiber connector 40.

As shown in FIG. 17, the light-emitting module 10 may be formed by using a so-called rigid-flexible circuit board 82 having a non-flexible rigid portion 86 fixed to the facet 44 of the optical fiber connector 40, and a flexible portion 85 having a portion extending from the rigid portion 86 and bent along the facets 43 and 44, and fixed to the facet 43. In the rigid-flexible circuit board 82, the flexible portion 85 may have an extending structure connected to the separately produced rigid portion 86, or an extending structure formed integrally with the rigid portion 86.

For example, when the flexible portion 85 is produced integrally with the rigid portion 86, the rigid portion 86 is formed in a multi-layer circuit board, and at least one layer thereof may be formed as the flexible portion 85 having the structure of the flexible circuit board 20, and extended in a desired shape.

According to the optical module in the first embodiment, miniaturization of the optical module itself is realized, the mounting space of the optical module can be reduced, and miniaturization and low cost of the optical module-mounting portion can be realized in the server system or the like. In the light-emitting module 10, the electric circuit 50 and the BGA substrate 30 mounted on the flexible circuit board 20 are overlapped on the facet 44 of the optical fiber connector 40 via the flexible circuit board 20. The light emitting element 11 is mounted on the facet 43 of the optical fiber connector 40. Then, the rear surface 26 of the flexible circuit board 20 is bent so that the flexible circuit board 20 is fitted and fixed to the optical fiber connector 40 such that the electric circuit 50 is housed in the space 42 of the optical fiber connector 40. Therefore, the outer diameter of the flexible circuit board 20 can be suppressed to about the outer diameter of the optical fiber connector 40.

An optical module according to a second embodiment of the present invention will be explained next. The optical module in the second embodiment is a light-receiving module, using a photodetector that receives an optical signal as the photoelectric element.

Figure 18:
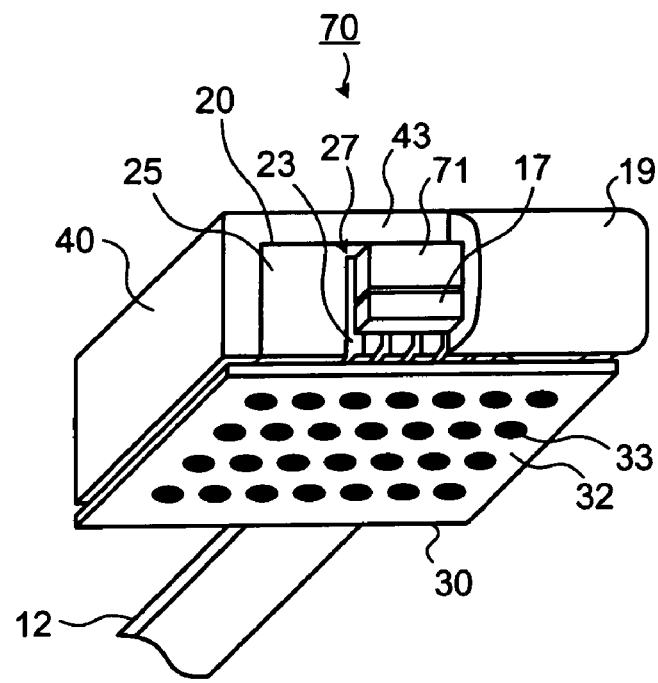
FIG. 18 is a perspective view of the configuration of a light-receiving module according to a second embodiment of the present invention.
Figure 19:
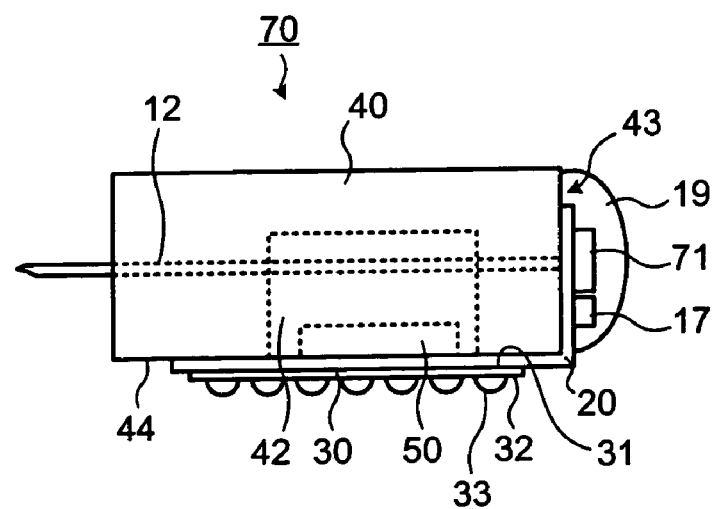
FIG. 19 is a side elevation of the light-receiving module according to the second embodiment.
Figure 20:
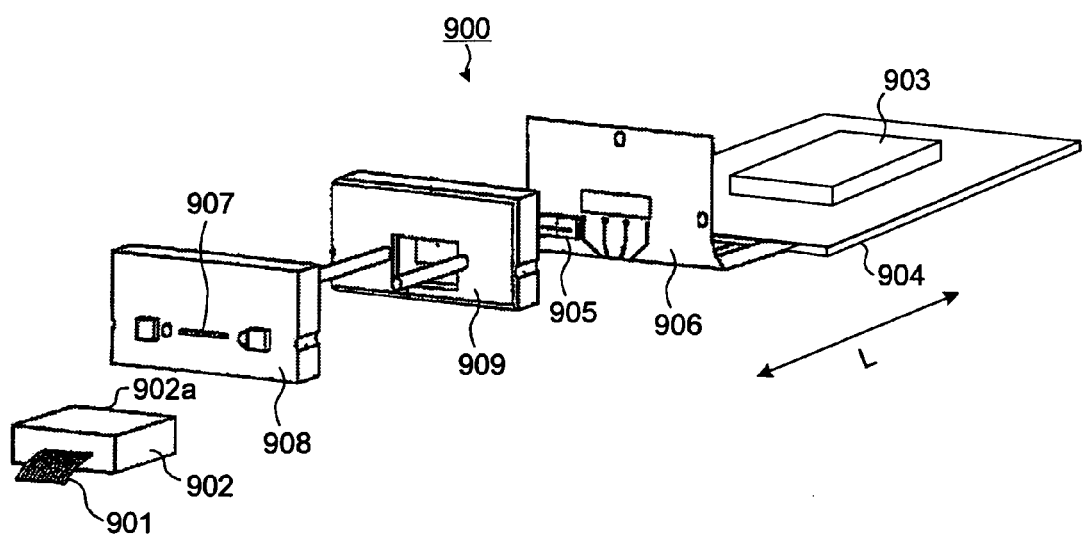
FIG. 20 is an exploded perspective view of a conventional optical module.

FIG. 18 is a perspective view of the configuration of a light-receiving module according to the second embodiment of the present invention. FIG. 19 is a side elevation of the light-receiving module. In the second embodiment, like reference numerals designate like parts and the explanation thereof is omitted. As shown in the drawing, a light-receiving module 70 has substantially the same configuration as that of the light-emitting module 10, and includes a photodetector 71, the optical fiber 12, the flexible circuit board 20, the BGA substrate 30, and the optical fiber connector 40, and further includes a preamplifier 17 as a photoelectric element-connecting portion electrically connected to the optical fiber connector 40 via the flexible circuit board 20. For the photodetector 71, for example, a surface incident type photo diode (PD) can be used.

In the light-receiving module 70, the preamplifier 17 is connected (mounted) near the mounting region 27 of the photodetector 71 on the surface 25 of the flexible circuit board 20. The photodetector 71 and the preamplifier 17 may be arranged away from each other, but since the photodetector 71 and the preamplifier 17 approach each other by mounting the preamplifier 17 near the photodetector 71, attenuation of electric signals and waveform deterioration in the preamplifier 17 can be avoided as much as possible. In the light-receiving module 70, the preamplifier 17 and the photodetector 71 are sealed together with the flexible circuit board 20 on the facet 43 of the optical fiber connector 40 by the external sealing portion 19.

Therefore, in the light-receiving module 70, the outer diameter similar to that of the light-emitting module 10 can also be realized, thereby reducing the mounting space to the optical module-mounting portion in the server system or the like, to enable miniaturization, low cost, and low power consumption. The electric circuit 50 may have the function of the preamplifier 17, instead of the preamplifier 17 provided near the photodetector 71. In this case, it is not necessary to provide the preamplifier 17 near the photodetector 71, and hence, the number of parts can be reduced.

According to the optical module in the second embodiment, the optical module itself can be miniaturized as in the optical module in the first embodiment, the mounting space can be reduced, and miniaturization and low cost of the optical module-mounting portion in the server system or the like can be realized. In the light-receiving module 70, the electric circuit 50 and the BGA substrate 30 mounted on the flexible circuit board 20 are overlapped on the facet 44 of the optical fiber connector 40 via the flexible circuit board 20. The photodetector 71 and the preamplifier 17 are also mounted on the facet 43 of the optical fiber connector 40. Then, the rear surface 26 of the flexible circuit board 20 is bent and the flexible circuit board 20 is fitted and fixed to the optical fiber connector 40, so that the electric circuit 50 is housed in the space 42 in the optical fiber connector 40. Therefore, the outer diameter thereof can be suppressed to nearly the same outer diameter of the optical fiber connector 40.

The present invention is not limited to the first and the second embodiments, and can be variously changed without departing from the scope of the invention. For example, instead of the electric circuit 50 mounted on the flexible circuit board 20, an electric circuit outside of the optical module may be connected separately to the flexible circuit board 20, so as to control the optical module.

According to the optical module of the present invention, miniaturization of the optical module can be realized, and the mounting space of the optical module can be reduced, thereby enabling miniaturization and low cost of the optical module-mounting portion.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An optical module comprising:
    a case having a substantially rectangular shape with a side wall and an open side adjacent to the side wall;
    a flexible member that is mounted on the case and has a first portion along the side wall and a second portion along the open side;
    a photoelectric element that is mounted on the first portion so that the flexible member is sandwiched between the photoelectric element and the case;
    an optical fiber that is housed in the case; and
    an electric circuit that is housed in the case and is located in a space between the optical fiber and the second portion of the flexible member, and is electrically connected to the photoelectric element through the flexible member.

2. The optical module according to claim 1, further comprising:
    an external-connection board that is mounted on the second portion and electrically connects the optical module to an external device.

3. The optical module according to claim 1, further comprising:
    a facet of the optical fiber is exposed to an outside of the case at the side wall thereof, for receiving an optical signal from or transmitting an optical signal to the photoelectric element through the flexible member.

4. The optical module according to claim 3, wherein the flexible member has a hole at a portion sandwiched between the photoelectric element and the facet of the optical fiber.

5. The optical module according to claim 3, wherein
    the flexible member is transparent at least at a portion sandwiched between the photoelectric element and the facet of the optical fiber.

6. The optical module according to claim 1, wherein a notch is formed between the first portion and the second portion on the flexible member.

7. The optical module according to claim 1, wherein the flexible member has a size that fits within the side wall and the open side.

8. The optical module according to claim 1, further comprising a first sealing portion that seals the photoelectric element on the flexible member.

9. The optical module according to claim 1, further comprising a second sealing portion that seals the electric circuit in the case.

10. The optical module according to claim 1, wherein the flexible member is a flexible circuit board.

11. The optical module according to claim 1, wherein the flexible member is a rigid-flexible circuit board that includes:
  a non-flexible portion that forms the second portion; and
  a flexible portion that forms the first portion and a part of the second portion.

12. The optical module according to claim 2, wherein the external-connection board is a ball-grid-array board.

13. The optical module according to claim 2, wherein the external-connection board includes a detachable connector that connects the external-connection board to the external device.

14. The optical module according to claim 1, wherein the photoelectric element is a light emitting element that converts an electric signal into an optical signal.

15. The optical module according to claim 1, wherein the photoelectric element is a light-sensitive element that converts an optical signal into an electric signal.

16. The optical module according to claim 15, further comprising:
  a first-stage amplifier that amplifies the electric signal from the light-sensitive element and is arranged near the light-sensitive element on the first portion.

17. An optical module having a circuit board, photoelectric element electrically connected and an optical fiber, comprising:
  a case inside which is mounted the circuit board and the optical fiber, having a substantially rectangular shape with at least one open side adjacent to a side wall; and
  a flexible member mounted on the case, having a first portion along the side wall and a second portion along the open side, wherein
  the first portion of the flexible member is sandwiched between the photoelectric element and the case, and
  the circuit board is located in a space between the optical fiber and the second portion of the flexible member, and is connected to the photoelectric element through the flexible member.

18. A light emitting module, comprising:
  a case with an open side;
  a flexible circuit board that is mounted outside the case, along the open side and along a side wall adjacent to the open side;
  an optical unit having at least one light emitting element, the optical unit being mounted on the flexible circuit board in an outward direction from the side wall;
  an optical fiber to transmit light received from the at least one light emitting element through at least one pair of corresponding holes in the case and the flexible circuit board, respectively, the optical fiber crossing the case; and
  an electric circuit that is housed in the case on a side of the flexible circuit board that covers the open side of the case, and is electrically connected to the at least one light emitting element through the flexible circuit board.

19. The light emitting module of claim 18, wherein the electric circuit is located in a space between the optical fiber and a portion of the flexible circuit board along the open side.

* * * * *

UNITED STATES PATENT AND TRADEMARK OFFICE
CERTIFICATE OF CORRECTION

PATENT NO. : 7,583,867 B2
APPLICATION NO. : 11/064454
DATED : September 1, 2009
INVENTOR(S) : Koji Terada et al.

It is certified that error appears in the above-identified patent and that said Letters Patent is hereby corrected as shown below:

Column 13, Line 34, change "photoelectric" to --a photoelectric--.

Signed and Sealed this

Seventeenth Day of November, 2009

David J. Kappos
*Director of the United States Patent and Trademark Office*